United States Patent [19]

Bossert

[11] 4,254,505
[45] Mar. 3, 1981

[54] NORMALIZATION METHOD AND APPARATUS USED WHEN QUANTITATIVELY MEASURING THE RECEPTION QUALITY OF A RECEIVED FREQUENCY-MODULATED ULTRASHORT-WAVE SIGNAL

[75] Inventor: Theodor T. Bossert, Munich, Fed. Rep. of Germany

[73] Assignee: Richard Hirschmann, Radiotechnischeswerk, Esslingen am Neckar, Del.X

[21] Appl. No.: 28,810

[22] Filed: Apr. 10, 1979

[51] Int. Cl.$^3$ ............................................. H04B 17/00
[52] U.S. Cl. ............................... 455/146; 324/57 N; 324/77 D; 455/148; 455/205; 455/245; 455/303
[58] Field of Search ................. 325/363, 67, 332, 333, 325/344, 474, 475, 476, 400, 408, 411, 65; 324/57 N, 77 B, 77 D, 78 Z, 123 C; 343/17.7; 455/63, 67, 145, 146, 148, 205, 214, 234, 245, 303

[56] References Cited

U.S. PATENT DOCUMENTS

| | | | |
|---|---|---|---|
| 2,489,254 | 11/1949 | Arnold et al. | 325/474 |
| 2,632,101 | 3/1953 | Quarles | 325/474 |
| 3,176,231 | 3/1965 | Vallese et al. | 325/476 |
| 3,699,463 | 10/1972 | Stone | 325/474 |
| 4,115,774 | 9/1978 | Tresselt | 343/17.7 |
| 4,151,475 | 4/1979 | von der Neyen | 325/474 |
| 4,197,501 | 4/1980 | Gammel et al. | 455/303 |

Primary Examiner—Marc E. Bookbinder
Attorney, Agent, or Firm—Michael J. Striker

[57] ABSTRACT

A frequency-modulated ultrashort-wave signal is received, but due to wave-reflection phenomena from physical bodies reflecting towards the receiving antenna is amplitude modulated, this amplitude modulation being dependent upon frequency. Derived from the frequency-modulated signal is a frequency-deviation signal indicating its instantaneous frequency deviation, and also an amplitude-indicating signal indicating its instantaneous amplitude. These can be fed to the x- and y-inputs of an oscilloscope for display of an amplitude versus frequency curve used to generate a quantitative characterization of reception quality, the oscilloscope screen being provided with a horizontal reference axis. In order that the horizontal reference axis implied by such curve stay in register with that on the screen, even during rotation of the receiving antenna, the amplitude-indicating signal is normalized with respect to the reflection-free amplitude value which the frequency-modulated signal would have in the absence of these wave-reflection phenomena. This is accomplished by applying the amplitude-indicating signal to a clocked amplitude regulator, which is clocked only when the frequency-deviation signal indicates substantially zero frequency deviation of the received frequency-modulated signal.

10 Claims, 4 Drawing Figures

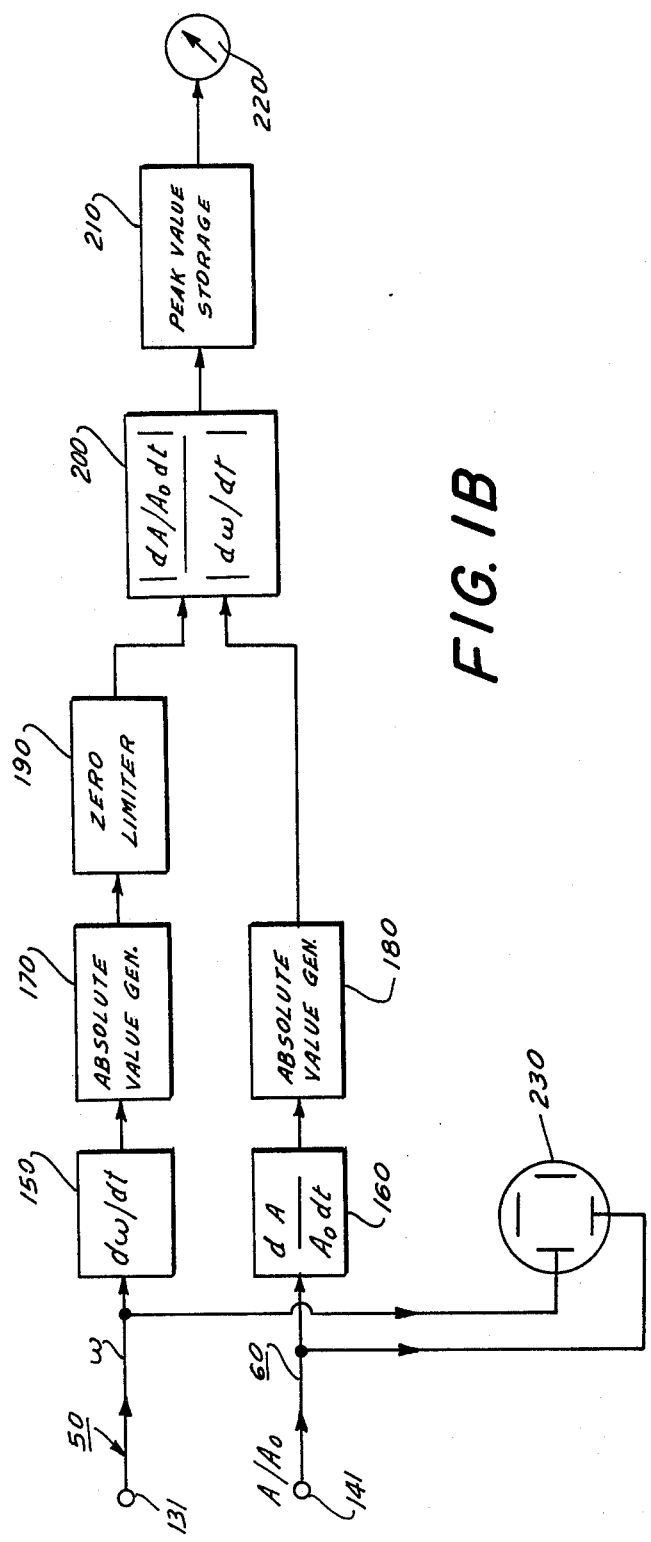
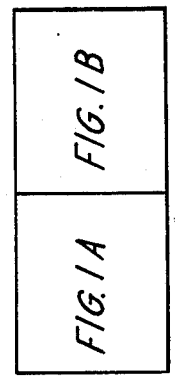
FIG. 1B
FIG. 1C
| FIG. 1A | FIG. 1B |

NORMALIZATION METHOD AND APPARATUS USED WHEN QUANTITATIVELY MEASURING THE RECEPTION QUALITY OF A RECEIVED FREQUENCY-MODULATED ULTRASHORT-WAVE SIGNAL

BACKGROUND OF THE INVENTION

The present invention relates to methods and apparatus for quantitatively measuring or characterizing the reception quality of a received frequency-modulated ultrashort-wave signal.

Because broadcast frequency-modulated ultrashort-wave signals spread out in space as they are propagated, such a signal when received by a particular receiving antenna will comprise not only a directly transmitted component but also, superimposed thereon, signal components transmitted to the receiving antenna indirectly as a result of reflection of the broadcast waves off of reflecting structures, such as buildings, geological structures and the like. Those signal components attributable to such reflection of the broadcast waves can be considered as constituting a noise signal which modulates the received IF carrier with respect to both amplitude and phase, in a sense of course detracting from reception quality.

Quantitative measurement or characterization of the quality of reception in such circumstances is extremely important in many instances, for example where that information is to be relied upon for steering or adjusting the receiving antenna. Methods and systems serving this purpose are known; attention is directed, by way of example, to the British Broadcasting Corporation research report BBC RD 1975/33.

With such conventional techniques, the amplitude modulation of the frequency-modulated carrier resulting from broadcast-wave reflections is ascertained as a function of frequency or frequency deviation of the carrier, and the quantitative reception quality characterization is derived from that relationship, in a manner discussed more fully below.

As already stated wave-reflection phenomena can be considered to act as a noise signal serving to modulate the frequency-modulated carrier with respect to both amplitude and phase. In general, it is not possible, i.e., during the actual reception of an ordinary ultrashort-wave FM broadcast, to continually ascertain with any meaningful precision the degree to which the carrier has become phase-modulated by the wave-reflection noise signal, because it is not possible to separately ascertain what phase variations, or components thereof, of the carrier signal are to be associated with the actual message signal, on the one hand, and the wave-reflection noise signal, on the other hand.

In contrast, it is possible to quantitatively ascertain the degree to which the frequency-modulated carrier has become amplitude-modulated by wave-reflection noise, for the simple reason that ultrashort-wave FM broadcasters of course take pains to assure that their transmitted carriers are of constant amplitude. Accordingly, at the receiver end, any amplitude fluctuations exhibited by the carrier can only be the result of noise.

In the already mentioned British Broadcasting Corporation research report BBC RD 1975/33 ("A field strength measuring receiver for band II"), a signal whose instantaneous value indicates the instantaneous amplitude of the frequency-modulated carrier is applied to the vertical-deflection input of an oscilloscope screen, and a signal whose instantaneous value indicates the instantaneous frequency or instantaneous frequency deviation is applied to the horizontal-deflection input. The resulting waveform generated on the oscilloscope screen displays the functional dependence of the frequency-modulated carrier's amplitude upon the frequency of the frequency-modulated carrier. The oscilloscope screen itself is provided with a horizontal axis directly calibrated in units of frequency. The oscilloscope screen is furthermore provided with a vertical axis directly calibrated in units of percentage amplitude modulation relative to the amplitude of the IF carrier if no wave-reflection noise phenomena were involved. E.g., when the ordinate value of the displayed graph is coincident with the horizontal axis of the display screen, this means that, here, the amplitude of the carrier equals 100% of the amplitude which the carrier would have if all wave-reflection modulating noise signals could somehow be removed. Where the ordinate value of the displayed curve is located above the horizontal axis, this means that the wave-reflection noise signals are decreasing the amplitude of the IF carrier relative to the imaginary reflection-free situation.

It is to be noted that merely in generating this displayed curve a very troublesome difficulty arises. In particular, the analyst must so adjust the gain of the y-deflection-input or amplitude-indicating signal that the horizontal reference axis implied by it coincide with the horizontal reference axis provided on the display screen. I.e., the horizontal reference axis on the display screen, considered as the 100% line for ordinate values of the curve, is to represent the ordinate value of the curve at which the actual amplitude of the received carrier coincides with the amplitude value which would exist in the imaginary reflection-free case. The horizontal reference axis implied by the displayed curve is the horizontal line joining all points on the curve whose ordinate values actually coincide with the amplitude which the carrier would have in the imaginary reflection-free case. In actual practice, adjusting the gain of the y-deflection-input or amplitude-indicating signal so that the implied horizontal reference axis coincides with the screen's horizontal reference axis proves to be extremely laborious and time-consuming.

The known system makes an attempt to deal with this problem. In particular, the known system uses negative-feedback control of the gain of the y-deflection or amplitude-indicating signal, to maintain constant the average (with respect to time) value of such signal. The analyst allows this automatic average-value negative-feedback regulation to operate for a while and then, at a suitable moment, presses a button which causes the average-value regulation to cease and the most recently established gain value for the amplitude-indicating signal to be locked in or held during the next part of the analyst's work. The working premise underlying this known technique is that by stabilizing (i.e., keeping constant) the average (with respect to time) value of the amplitude-indicating signal, there will be achieved a balancing out or cancellation of the opposite effects which the reflected-wave noise has on the amplitude of the carrier. I.e., whether the reflected-wave noise amplitude-modulates the carrier in a sense increasing its amplitude, or in a sense decreasing its amplitude, depends of course upon the phase of the reflected waves received by the antenna, and the instantaneous phase of the reflected waves varies with the instantaneous value of the actual message signal of interest. Of course the instantaneous value of the message signal will in general, during an ordinary ultrashort-wave FM broadcast, vary, i.e., depending upon message content, whether music or speech is involved, and so forth. Accordingly, merely to rely on the average (with respect to time) value of the carrier's amplitude is to rely upon a very inconstant quantity, and is merely to hope that the averaging-out process will itself balance out or cancel the opposite effects exerted from one moment to the next (or indeed from one broadcast program to the next) upon the amplitude of the carrier.

The very simple drawback of this known technique is that in fact, as a generality, the horizontal reference axis implied by the displayed amplitude-versus-frequency curve does not actually coincide with the horizontal reference axis provided on the oscilloscope screen. It will be understood that this lack of registration is a serious problem which goes beyond inconvenience in reading-off values from the screen, i.e., goes beyond the need for "mental" subtraction or addition to compensate for this lack of registration. Instead, when the 100%-ordinate-value horizontal reference axis implied by the displayed curve fails to coincide with that on the screen, the analyst must attempt to perform a computed conversion of actual scale, before he can quantitatively interpret the displayed curve. Furthermore, before the analyst can even attempt to compute such a scale conversion, he must know where the horizontal reference axis implied by the displayed curve is located, and such location is not always self-evident. Besides all this, there is the additional problem that, after the analyst has computed the necessary scale conversion and performed his quantitative reception-quality characterization, he cannot then proceed to vary the basic reception situation with which he is dealing without then losing what he has just achieved. For example, if the quantitative reception-quality characterization derived by the analyst indicates poor reception quality, and if as a result the analyst commands that the receiving antenna be steered to a different direction, this will, in general, basically alter the effects of the wave-reflection noise phenomena upon the carrier, and the whole procedure must in general be repeated from the start. I.e., after performing the quantitative analysis with the antenna aimed in a first direction, the analyst cannot simply rotate the antenna and immediately know whether this has improved or decreased the reception quality.

SUMMARY OF THE INVENTION

It is a general object of the present invention to provide an improved method and apparatus of the type discussed above, but of such a character as to assure that the horizontal reference axis implied by the displayed amplitude-versus-frequency curve actually and always coincides with the horizontal reference axis provided on the display screen.

It is a related object to provide an improved method and apparatus such that the horizontal-reference-axis registration occurs automatically, and implemented by relatively simple means.

It is a further object to provide an improved method and apparatus such that the horizontal-reference-axis registration is unaffected by fundamental changes in the reception situation, e.g., is unaffected by progressive steering of the receiving antenna.

It is the general concept of the invention to employ a negative-feedback regulation of carrier amplitude which, unlike the prior art, is responsive, in particular, to the amplitude value which the frequency-modulated carrier would have if no wave-reflection noise were present, i.e., the negative-feedback regulation being responsive to such amplitude value to the maximum extent possible, with the amplitude regulation being, to the maximum extent possible, not responsive to carrier amplitude values resulting from wave-reflection noise. In this way, during the entirety of the measuring operation, the automatic regulation of the aforediscussed amplitude-indicating signal serves to normalize the amplitude-indicating signal of the prior art with respect to the imaginary reflection-free amplitude value, as a result of which there is always a fixed relationship between the implied horizontal reference axis and the horizontal reference axis on the screen, i.e., so that the two can readily be brought into registration and then stay permanently in registration. With the inventive technique, the horizontal reference axis implied by the now normalized amplitude-versus-frequency curve no longer wanders or drifts, in the y-direction, towards and away from the horizontal reference axis of the screen during the course of the measuring work. In contrast, the amplitude fluctuations of the displayed curve attributable to wave-reflection noise remain unaffected by the system and are displayed truthfully as a function of frequency, albeit now normalized. Because the amplitude information in the displayed amplitude-versus-frequency curve is now normalized by negative-feedback regulation of the imaginary reflection-free amplitude value of the carrier, the system is immune to fundamental changes in reception conditions. For example, if the receiving antenna is slowly rotated during the measuring operation, no readjustments or renewed setting-up of the display need be performed, making possible direct comparison between the reception-quality quantitative characteristics of all available antenna directions.

The novel features which are considered as characteristic for the invention are set forth in particular in the appended claims. The invention itself, however, both as to its construction and its method of operation, together with additional objects and advantages thereof, will be best understood from the following description of specific embodiments when read in connection with the accompanying drawings.

BRIEF DESCRIPTION OF THE DRAWINGS

FIGS. 1A and 1B are the left and right halves of an exemplary circuit embodying the concepts of the present invention, with FIG. 1C graphically depicting the relationship between FIGS. 1A and 1B.

DESCRIPTION OF THE PREFERRED EMBODIMENTS

Figure 1A:
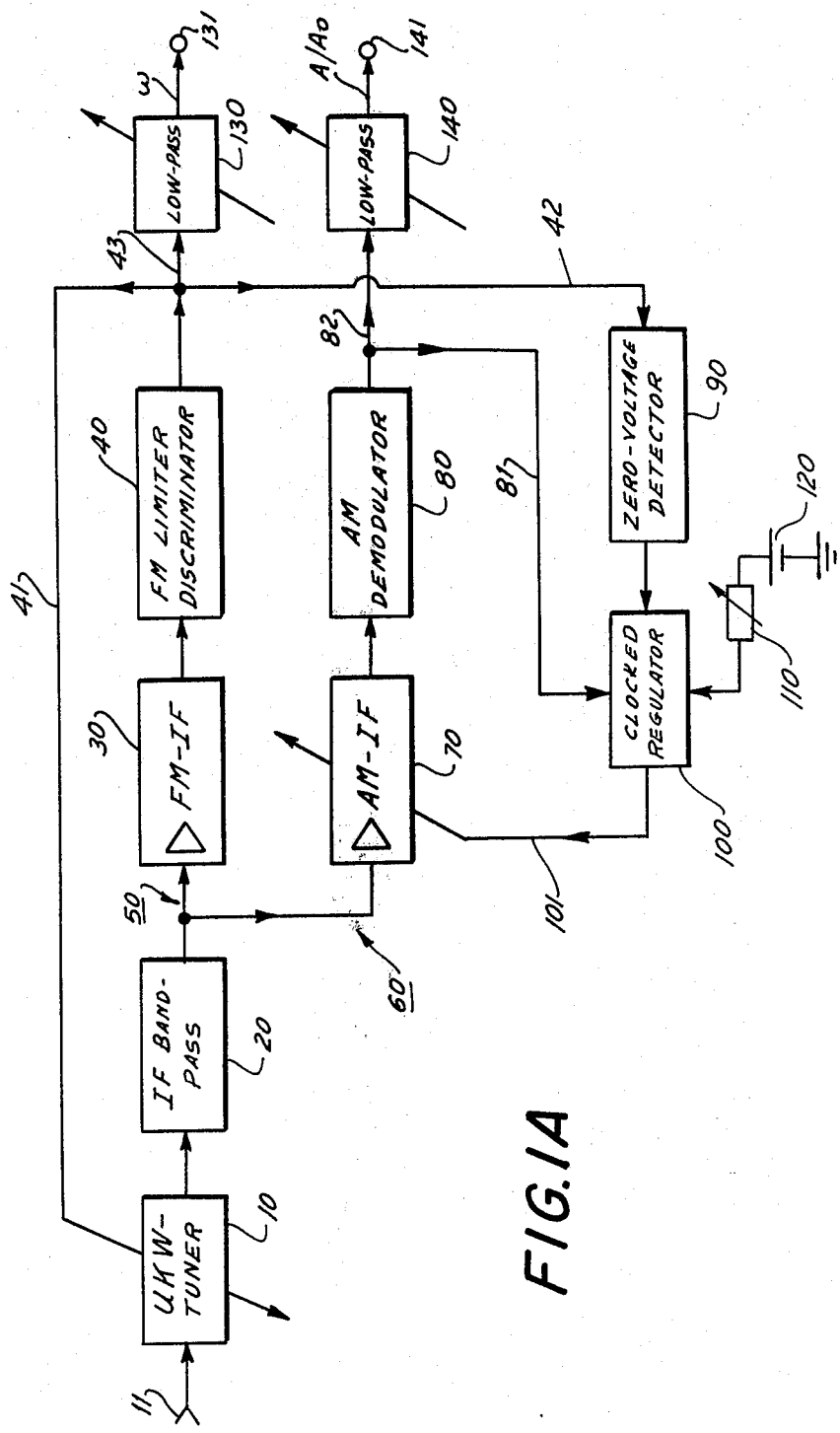

FIGS. 1A and 1B, as symbolically indicated in FIG. 1C, are the left and right halves of a single circuit diagram. The circuitry shown in FIG. 1A mainly comprises a conventional ultrashort-wave FM receiver, supplemented in accordance with the present invention for generating quantitative reception-quality information.

In FIG. 1A, numeral 10 denotes an ultrashort-wave FM tuner supplied with an ultrashort-wave FM signal by a receiving antenna 11. In per se conventional manner, the output signal of tuner 10 is transmitted through an IF bandpass filter 20, the latter serving to pass on only the IF carrier signal recovered in tuner 10. The output of IF bandpass filter 20 branches out into two signal branches 50, 60. Signal branch 50, comprising the other components of a conventional FM receiver, includes an FM intermediate-frequency amplifier 30, followed by a limiter-discriminator 40. The output signal from limiter-discriminator 40 is the recovered message signal and can, if desired, be applied to a transducer system for audible reproduction, although that is not shown in the drawing, the illustrated circuitry relating only to quantitative reception-quality measurement.

As already stated, the still frequency-modulated IF carrier is also applied to a signal branch 60, which comprises a controllable-gain AM intermediate-frequency amplifier 70, followed by an amplitude demodulator 80. The signal produced at the output of amplitude demodulator 80 indicates the amplitude of the frequency-modulated IF carrier. The gain-control input of controllable-gain amplifier 70 is connected to the output of a clocked negative-feedback regulator 100 via a control line 101. The actual-amplitude signal input of clocked amplitude regulator 100 is connected, via a feedback line 81, to the output of amplitude demodulator 80, for receipt of the signal indicating the actual amplitude of the IF carrier. The desired-amplitude signal input of regulator 100 receives a desired-amplitude signal via a potentiometer 110 from a D.C. voltage source 120. The clocked amplitude regulator 100 is clocked by a zero-voltage detector 90, e.g., a window discriminator, whose input is connected via a line 42 to the output of the limiter-discriminator 40. When the output signal of discriminator 40 equals zero, zero-voltage detector 90 clocks clocked amplitude regulator 100, the latter registers the actual-amplitude signal on line 81, produces on line 101 a corrective gain-control signal, and the latter signal is held and persistently applied to the gain-control input of amplifier 70 until the next time amplitude regulator 100 is clocked.

The output signal of discriminator 40 is additionally fed back to the negative-feedback control input of ultra-short-wave tuner 10 via a line 41, for conventional negative-feedback regulation during frequency demodulation. The respective output signals from discriminator 40 and from amplitude demodulator 80 are transmitted, via respective lines 43 and 82 and variable-bandwidth low-pass filters 130 and 140. The signal produced at the output 131 of filter 130 corresponds to the instantaneous frequency deviation $\omega$ of the frequency-modulated IF carrier, as will be understood by persons skilled in the art. The signal produced at the output 141 of low-pass filter 140 corresponds to the ratio $A/A_o$, wherein A is, very simply, the instantaneous amplitude of the frequency-modulated IF carrier, and wherein $A_o$ is the constant amplitude which the frequency-modulated IF carrier would have if, somehow, the sources of wave-reflection noise, i.e., the responsible reflecting bodies, could be removed from the reception situation. Accordingly, the output signal $A/A_o$ at terminal 141 corresponds to the instantaneous amplitude of the frequency-modulated IF carrier, but normalized with respect to the imaginary reflection-free amplitude value of the carrier.

As shown in FIG. 1B, the frequency or frequency-deviation signal $\omega$ is applied to the horizontal-deflection input of an oscilloscope 230, whereas the normalized amplitude signal $A/A_o$ is applied to the vertical-deflection input thereof.

The circuit depicted in FIG. 1A operates as follows:

Components 10, 20, 30, 40 merely correspond to a conventional ultrashort-wave FM receiver, and therefore their operation should not require detailed explanation, except to note once more that the output signal of limiter-discriminator 40 is here being used to derive a signal $\omega$ indicating the instantaneous value of the frequency deviation of the frequency-modulated IF carrier, i.e., per se, as opposed to mere message-signal recovery, although of course the output signal from discriminator 40 can also, if desired, be used for audible message-signal reproduction.

In signal branch 60, the still frequency-modulated IF carrier is amplified by AM intermediate-frequency amplifier 70 with a gain automatically established by negative-feedback amplitude regulator 100. However, the negative-feedback regulation of the IF carrier amplitude is performed in such a way that, to the extent possible, the negative-feedback regulation is responsive only to the reflection-free $A_o$ component of the carrier amplitude and, to the extent possible, not at all responsive to the component(s) of the carrier amplitude attributable to wave-reflection phenomena. As a result, the reflection-free component $A_o$ of the IF carrier is, i.e., in circuit branch 60, maintained constant, e.g., irrespective of what physical amplitude fluctuations might be occurring during ongoing receiving-antenna rotation, for example. Accordingly, the actual instantaneous IF carrier amplitude A is at all times kept normalized with respect to such constant reflection-free amplitude component $A_o$. This special-purpose amplitude regulation is made possible, in the illustrated embodiment, by the zero-voltage detector 90 which ascertains when the instantaneous value of the frequency deviation $\omega$ of the frequency-modulated IF carrier, as detected at the output of limiter-discriminator 40, goes to zero. When the frequency deviation $\omega = 0$, this means, or here is presumed to mean, that at this moment the amplitude of the still frequency-modulated IF carrier at the output of IF bandpass filter 20 corresponds to the reflection-free amplitude value $A_o$ discussed above. In dependence upon this detection performed by detector 90, clocked amplitude regulator 100 is clocked and, in dependence upon the amplitude-indicating signal on line 81 and the desired-amplitude signal from potentiometer 110, produces on line 101 a gain-control signal for amplifier 70, and this gain-control signal is held and persists on line 101 until the next time that clocked regulator 100 is thusly clocked. In particular, regulator 100 becomes unresponsive to the actual-amplitude signal on line 81 as soon as zero-voltage detector 90 detects, at the output of limiter-discriminator 40, a non-zero voltage.

Figure 2:
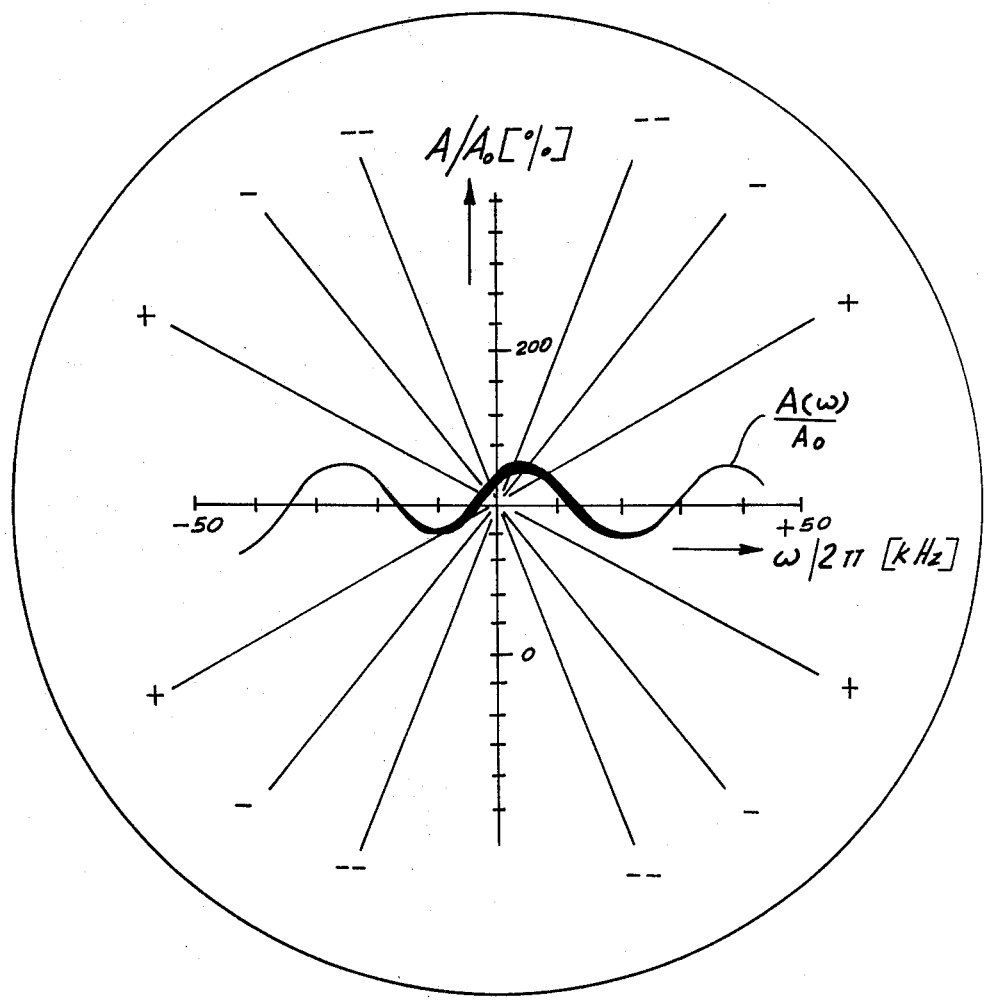
FIG. 2 depicts an amplitude-versus-frequency curve, normalized in accordance with the concepts of the present invention, on the display screen of an oscilloscope.

In FIG. 1B, as already stated, the two signals $\omega$ and $A/A_o$ are shown respectively applied to the horizontal- and vertical-deflection inputs of an oscilloscope 230. FIG. 2 depicts the appearance of the displayed normalized-amplitude versus frequency-deviation curve. The horizontal reference axis, calibrated in units of frequency, on the oscilloscope screen and the horizontal reference axis implied by the displayed amplitude-versus-frequency curve are brought into register by adjustment of potentiometer 110 in FIG. 1A, and thereafter stay in register, even for example if the receiving antenna is thereafter rotated, making it simple to perform the measurements needed for generation of a quantitative reception-quality characterization. Measuring accuracy is, in the illustrated embodiment, further improved by the provision of the two variable-bandwidth low-pass filters 130, 140 at the x-and y-deflection inputs of the oscilloscope, and by correctly selecting the bandwidths of the variable-bandwidth filters 130, 140 the curve's lack of ambiguity is preserved.

In FIG. 2, the horizontal reference axis provided on the screen is, as already stated, calibrated in units of frequency, whereas the vertical scale is calibrated in units of percentage amplitude modulation, i.e., of the frequency-modulated IF carrier relative to the amplitude value $A_o$ which the carrier would have in the absence of wave-reflection phenomena. Thus, for example, where a point on the displayed normalized-amplitude versus frequency-deviation curve intersects the horizontal reference axis, such point has an ordinate value of 100%, indicating that, at this frequency, the actual amplitude of the frequency-modulated IF carrier equals the presumed reflection-free amplitude value $A_o$. For the sake of explanation, the amplitude-versus-frequency curve illustrated is sinusoidal. However, persons skilled in the art will understand that, in general, the reflected-wave phenomena encountered will result in a displayed curve of substantially greater complexity.

The deriving of a quantitative reception-quality characterization from the displayed curve can be performed in a variety of conventional ways. However, it is presently preferred to employ, for the deriving of the reception-quality characterization, a technique implemented using the circuitry depicted in FIG. 1B.

In FIG. 1B, the instantaneous frequency-deviation signal $\omega$ is applied to the input of a differentiator 150, at whose output is produced a signal corresponding to the derivative of frequency deviation with respect to time, $d\omega/dt$. Likewise, the normalized-amplitude signal $A/A_o$ is applied to a differentiator 160, at whose output is produced a signal corresponding to the time derivative of the normalized IF carrier amplitude, $dA/A_o dt$. The signal $d\omega/dt$ is transmitted through an absolute-value generator 170 which produces a signal whose magnitude corresponds to that of $d\omega/dt$ but is independent of the sign of the latter expression; the absolute-value generator can, merely by way of example, comprise an operational amplifier provided with a bridge rectifier. The output signal from absolute-value generator 170 is transmitted through a zero limiter 190 and then applied to the first input of a divider 200. The signal $dA/A_o dt$ is transmitted through a second absolute-value generator 180 to the second input divider 200, without the intermediate of a zero limiter. The signal produced at the output of divider 200 corresponds to the quotient $$\frac{\left|\frac{dA}{A_o dt}\right|}{\left|\frac{d\omega}{dt}\right|} = \left|\frac{\delta A}{A_o \delta\omega}\right|$$

The zero limiter 190 serves to prevent the denominator of the expression on the left, i.e., $|d\omega/dt|$ from going to zero and making the differential quotient go to infinity.

Accordingly, the output signal from divider 200 indicates the magnitude of the slope or gradient of the displayed normalized-amplitude versus frequency-deviation curve.

In accordance with this preferred technique for deriving of the quantitative reception-quality characterization, the extreme values of the differential quotient in question are utilized as a direct measure of the quality of the noise-modulated ultrashort-wave FM signal being received by antenna 11 (FIG. 1A). To this end, the output signal from divider 200 is applied to an extreme-value storage 210 which may, for example, comprise an emitter follower with a storage capacitor or be of another conventional type. The output signal of the extreme-value storage 210 is applied to a digital or analog indicator 220, e.g., a digital or analog voltmeter.

Indeed, when the circuitry shown in FIG. 1B is employed to automatically generate the quantitative reception-quality characterization, display of the amplitude-versus-frequency curve on the oscilloscope screen of FIG. 2 actually becomes in a sense superfluous, although certainly helpful for back-up purposes.

If the frequency-deviation signal $\omega$ and the normalized IF-carrier amplitude-indicating signal $A/A_o$ are fed to the oscilloscope for curve display as shown in FIG. 2, then for off-the-screen read-off of the slope of the displayed curve, which slope corresponds to the differential quotient of interest, the screen can be provided, as shown in FIG. 2, with a family of straight lines all intersecting the origin and having different respective slopes. This makes possible a quick visual evaluation, albeit a somewhat coarse one, of reception quality. In FIG. 2, six such straight lines, having three different slopes, are provided, the one with the lowest slope being designated "+", the one with intermediate slope being designated "−", and the one with the greatest slope being designated "−−". The ranges of curve slope associated with these slope limits correspond to the following ranges of reception quality:

+ reception of music still good;
− reception of music bad, but of speech still good;
−− reception of speech bad.

It will be understood that each of the elements described above, or two or more together, may also find a useful application in other types of circuits and display techniques differing from the types described above.

In particular, after the technique of FIG. 1A has been performed, the quantitative reception—quality characterization can, as already stated, be implemented by conventional techniques not in accordance with the technique depicted in FIG. 1B herein, although the unconventional technique of FIG. 1B is presently preferred.

While the invention has been illustrated and described as involving a particular method of effecting horizontal-axis registration in a curve-display technique used for quantitatively characterizing the quality of an ultrashort-wave FM reception, it is not intended to be limited to the details shown, since various modifications and structural changes may be made without departing in any way from the spirit of the present invention.

Without further analysis, the foregoing will so fully reveal the gist of the present invention that others can by applying current knowledge readily adapt it for various applications without omitting features that, from the standpoint of prior art, fairly constitute essential characteristics of the generic or specific aspects of this invention.

What is claimed as new and desired to be protected by Letters Patent is set forth in the appended claims:

1. An improved method of quantitatively measuring the reception quality of a frequency-modulated ultrashort-wave signal where the frequency-modulated signal exhibits amplitude modulation resulting from wave-reflection phenomena, the method being of the type wherein the amplitude and the frequency deviation of the frequency-modulated ultrashort-wave signal are separately measured and the functional dependence of the former upon the latter is ascertained, the improvement comprising deriving from the frequency-modulated ultrashort-wave signal an amplitude-indicating signal indicating the amplitude of the frequency-modulated signal, and maintaining the amplitude-indicating signal normalized with respect to the reflection-free amplitude which the received frequency-modulated signal would exhibit as follows: generating a frequency-deviation signal indicating the instantaneous frequency deviation of the received frequency-modulated ultrashort-wave signal, automatically regulating, with a negative-feedback amplitude regulator, the gain of the amplitude-indicating signal, generating a frequency-deviation-zero signal when the frequency-deviation signal indicates substantially zero frequency deviation and applying the frequency-deviation-zero signal to the negative-feedback amplitude regulator so that the latter responds to the value of the amplitude-indicating signal in response to the frequency-deviation-zero signal.

2. The method defined in claim 1, comprising passing the received frequency-modulated ultrashort-wave signal through a tuner and then through an IF bandpass filter to produce a frequency-modulated IF signal, the deriving of the amplitude-indicating signal comprising passing the frequency-modulated IF signal through an AM IF amplifier and then through an amplitude demodulator, the generating of the frequency-deviation signal comprising passing the frequency-modulated IF signal through an FM IF amplifier and then through a limiter-discriminator, said regulating step comprising regulating the gain of the AM IF amplifier with a clocked amplitude regulator and said step of generating the frequency-deviation-zero signal further comprising detecting the limiter-discriminator output and providing said frequency-deviation-zero signal when said output is substantially zero and clocking said regulator with said frequency-deviation-zero signal.

3. An electronic circuit for use in quantification of reception quality of a convention AM-distorted FM transmission which has time-varying amplitude and instantaneous frequency deviation characteristics, comprising: an amplitude monitor responsive to the FM transmission and operating in a manner that the amplitude monitor produces an amplitude signal proportional to the amplitude of the transmission;

a frequency-deviation monitor responsive to the FM transmission and operating in a manner that the frequency-deviation monitor produces a frequency-deviation signal proportional to the instantaneous frequency deviation of the FM transmission;

a normalizer responsive to the amplitude signal and the frequency-deviation signal and controlling the amplitude monitor in a manner that a normalized signal is produced at an output thereof, said normalized signal being proportional to a fraction in which actual amplitude of the FM transmission is the numerator and in which the denominator is an amplitude which a like second FM transmission would have had in the event that said second FM transmission were AM-undistorted; and a signal processor responsive to the frequency deviation signal and the normalized signal for providing quality-of-reception information.

4. The circuit defined by claim 3, wherein the amplitude monitor includes a variable-gain intermediate-frequency amplifier and an AM demodulator, and wherein the normalizer includes a regulator which is connected to the output of the amplitude monitor, the frequency-deviation monitor and the variable-gain intermediate-frequency amplifier, the regulator responding to the frequency-deviation signal and varying gain of the variable-gain intermediate-frequency amplifier in a manner that a negative feedback loop is established.

5. The circuit defined by claim 4, wherein the regulator is variable, whereby magnitude of the normalized signal can be altered independently of variation of the normalized signal with time.

6. The circuit defined by claim 4, further including a zero detector connected to the frequency-deviation monitor and to the regulator, the zero detector responding to the frequency-deviation signal and causing the regulator to vary gain of the variable-gain intermediate-frequency amplifier when and only when the frequency-deviation signal is equal to zero.

7. The circuit defined by claim 3, wherein the signal processor includes a first low-pass filter and a second low-pass filter, the first low-pass filter being connected to the frequency-deviation monitor and responding to the frequency-deviation signal and the second low-pass filter being connected to said output and responding to the normalized signal.

8. The circuit defined by claim 4, wherein the signal processor further includes an oscilloscope with X and Y inputs perpendicular to each other, wherein each of the first and second low-pass filters is connected to a corresponding one of the X and Y inputs.

9. The circuit defined by claim 7, wherein the signal processor further includes a quantifier producing a reception quality signal proportional to a partial derivative of the normalized signal with respect to non-zero frequency-deviation signals.

10. The circuit defined by claim 9, wherein the quantiffier produces a reception quality signal proportional to absolute value of a partial derivative of the normalized signal with respect to non-zero frequency-deviation signals.

* * * * *